United States Patent [19]
El-Maleh et al.

[11] Patent Number: 5,528,604
[45] Date of Patent: Jun. 18, 1996

[54] TEST PATTERN GENERATION FOR AN ELECTRONIC CIRCUIT USING A TRANSFORMED CIRCUIT DESCRIPTION

[75] Inventors: Aiman H. El-Maleh, Montreal, Canada; Wojciech P. Maly, Pittsburgh; Thomas E. Marchok, Latrobe, all of Pa.; Janusz E. Rajski, West Montreal, Canada

[73] Assignee: Carnegie Mellon University, Pittsburgh, Pa.

[21] Appl. No.: 374,948

[22] Filed: Jan. 18, 1995

[51] Int. Cl.$^6$ ................................................. G06F 11/10
[52] U.S. Cl. ................................. 371/27; 395/183.09
[58] Field of Search .................... 371/27, 15.1, 16.1, 371/22.1, 22.2, 22.6, 23, 72; 395/183.01, 183.09, 183.13

[56] References Cited

U.S. PATENT DOCUMENTS 5,272,390  12/1993  Watson, Jr. et al. .................... 307/369

OTHER PUBLICATIONS

Marchok et al., "Complexity of Sequential ATPG," European Design and Test Conf., Mar. 7–9, 1995, Paris, France.
El–Maleh et al., "On Test Set Preservation of Retimed Circuis," 32nd ACM/IEEE Design Auto. Conf., Jun. 6–10 1995, San Francisco.
Niermann et al., "HITEC: A Test Generation Package for Sequen. Circuits," Proc. of the Euro. Conf. on Design Automation, pp. 214–218, 1991.
Niermann et al., "Proofs: A Fast Memory Efficient Sequential Circuit Fault . . . ," Proc. of the 27th ACM/IEEE Design Auto. Conf., 1990, pp. 535–540.
Leiserson et al., "Optimizing Synchronous Circuitry by Retiming Adv. Res. in VLSI:" Proc. of 3rd Caltech Conf., pp. 87–116, 1983.
Sentovich et al., "Sequential Circuit Design Using Synthesis & Optimization," IEEE 1992 Inter. Conf. on Comp. Designs: VLSI in Computers and Processors, pp. 328–333.
Lee et al., "Hope: An Efficient Parallel Fault Simulator for Synchronous Sequential Circuits," Proc. of the 29th ACM/IEEE Design Auto. Conf., 1992, pp. 336–340.

Primary Examiner—Vincent P. Canney
Attorney, Agent, or Firm—Townsend and Townsend and Crew

[57] ABSTRACT

Test pattern generation for a sequential logic circuit having combinational logic elements and sequential elements (D flip-flops) is enhanced in generation time and test pattern quality by first transforming the circuit to simplify the circuit for test pattern generation. In one embodiment the retiming transformation is used in which sequential elements are moved across combinational logic elements to increase the ratio of the total number of states which are traversable, and thus simplify the circuit for test pattern generation. The test set generated is equally applicable to the transformed test circuit as well as the manufactured circuit.

8 Claims, 4 Drawing Sheets

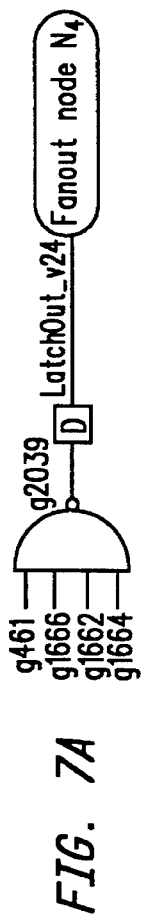
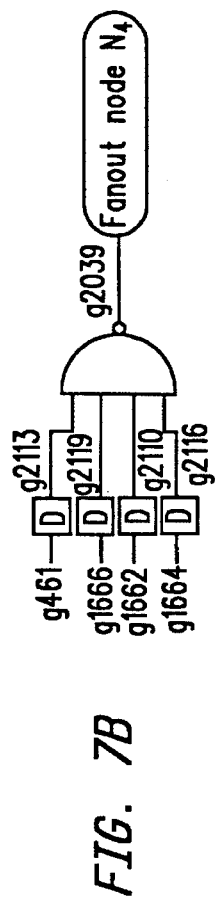
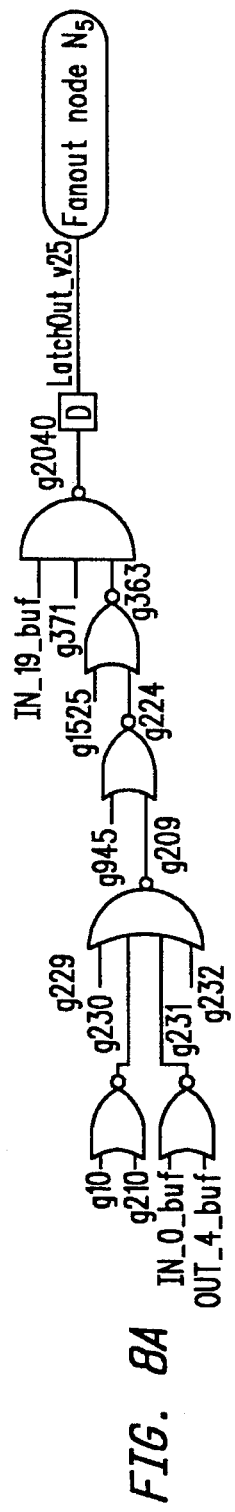
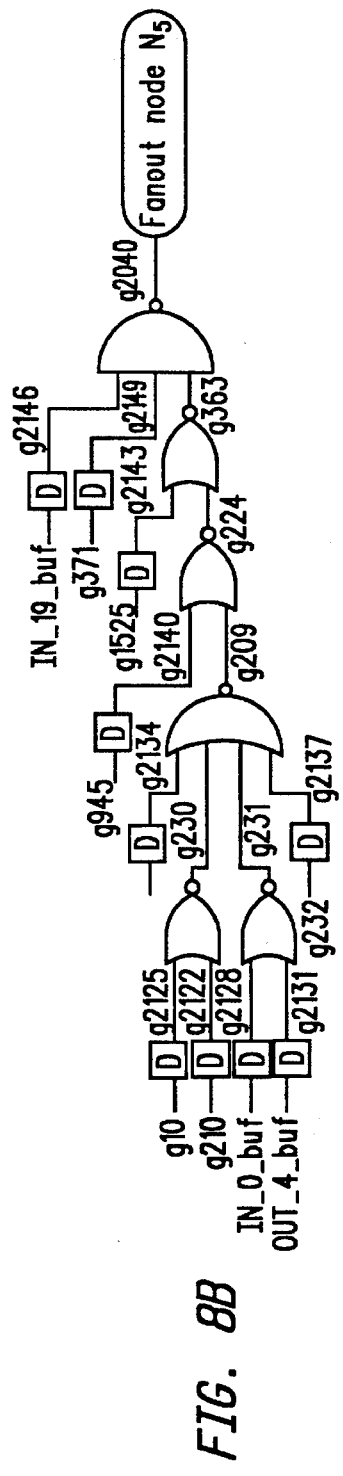
FIG. 7A
FIG. 7B
FIG. 8A
FIG. 8B

TEST PATTERN GENERATION FOR AN ELECTRONIC CIRCUIT USING A TRANSFORMED CIRCUIT DESCRIPTION

BACKGROUND OF THE INVENTION

This invention relates generally to fault testing of integrated logic circuits, and more particularly the invention relates to test pattern generation using a transformed circuit description to facilitate the generation of the test pattern.

Present day very large scale integrated (VLSI) logic circuits typically contain many thousands of circuit elements. Since not all fabricated circuits are guaranteed to be fault-free, testing needs to be done to isolate fault-free from faulty circuits. It has been estimated that the cost of detecting and replacing a faulty integrated circuit increases by a factor of 10 with each level of packaging, i.e., chip—printed circuit board—system employing multiple printed circuit boards. Thus, the detection of a faulty chip prior to further packaging is of great importance.

Manufacturing test sets are applied to detect the presence of physical faults which render incorrect operation of the circuit. One measure of the completeness of a manufacturing test set is the percentage of defects (physical faults) which it is able to detect. Most defects can be represented as logical faults. Since the effects of these logical faults on the behavior of the circuit are well defined, a test for a physical fault can be derived based upon the difference in the operation of the circuit in both the presence and absence of the fault. Since all possible faults can be enumerated, the completeness (quality) of the manufacturing test set can be calculated as the percentage of the total number of faults which a test set detects. The ultimate metric of quality of a manufacturing test set is the escape rate, that being the percentage of faulty circuits which are not detected as such. In general, the larger the fault coverage the higher the resultant test quality of a manufacturing test set.

Manufacturing test sets or test patterns for integrated circuit testing can be generated manually or by using Automated Test Pattern Generation (ATPG) software, such as HITEC, which is a commercially available system that runs on commercially available workstations. The test patterns are usually generated based on a structural description of the circuit in which the circuit is described as a connection of basic elements such as logic gates (e.g., AND, OR, NOT). In addition to the quality of a test set which an ATPG is able to produce, the time required for the ATPG to generate a test set is an important measure of the effectiveness of the ATPG. While test patterns which detect nearly all faults can be generated in a reasonable amount of time for large combinational circuits given only a structural description of the circuit, none of the existing test pattern generation algorithms based on a structural description of a sequential circuit can generate a high quality test set in a reasonable amount of time for large sequential circuits. Generating a test set for a sequential circuit requires identifying a sequence of values to be applied during multiple clock periods to the functional inputs of the circuit. The multiple clock periods are required for a signal to propagate from the functional inputs to the functional outputs in the sequential circuit. The interdependency of logic values at various internal nodes of the circuit across time frames is the primary reason for the increasing complexity of sequential circuit test generation.

Since ATPG systems are typically unable to create manufacturing test sets which attain reasonable levels of test quality for most industrial sequential circuits, circuit structures are often altered to provide increased controllability and observability of internal nodes of the circuit.

Two of the most commonly used techniques of altering the structure of sequential circuits to reduce the difficulty of generating manufacturing test sets are the so-called full scan or partial scan techniques such as described in Trischler U.S. Pat. No. 4,534,028 and Agrawal U.S. Pat. No. 4,493,077. In scan testing, test control circuitry is included as part of the logic of a chip. This circuitry provides increased controllability and observability of sequential elements of the circuit, thus simplifying the task of generating the manufacturing test set. While full scan and partial scan techniques provide the benefits of increasing the level of fault coverage which an ATPG can attain and decreasing the amount of time required to generate the manufacturing test set, implementation of the techniques increases the circuit chip area and decreases the circuit operating speed.

The present invention is directed to providing an improved method and apparatus for automated test pattern generation for sequential logic circuits without a need for increasing silicon area or performance loss.

SUMMARY OF THE INVENTION

In accordance with the invention test pattern generation time is reduced and test pattern quality is enhanced by using a transformed version of a manufactured circuit for the test pattern generation with the generated test set achieving the same test quality when applied to the original manufactured circuit. This is a departure from the standard practice of using only the manufactured circuit in generating the manufacturing test set.

The essence of the invention is to perform test generation on a transformed version of the circuit to which the resultant test set will be applied. The transformation between the original circuit and the circuit used for test generation should be accomplished in a manner which preserves the test set.

The invention is based upon the existence of transformations which alter the structure of the circuit and which are testability preserving. A transformation is said to preserve the testability of a test set if the test set detects the same set of corresponding faults when applied to both the transformed and non-transformed circuits. Test preserving transformations allow tests generated for one version of the circuit to attain essentially the same level of fault coverage (and therefore test quality) when applied to a transformed version. Because some of these test set preserving transformations have been shown to significantly impact the difficulty of automatic test pattern generation it is possible to significantly reduce the cost of test generation by targeting a transformed version of the circuit for test generation (instead of the version of the circuit which will be fabricated). The resultant test set can be applied to the original (non-transformed) circuit and the same level of test quality will be attained as if the test set were applied to the transformed circuit. The advantage of the above process is a decrease in test generation cost and/or an increase in the test quality which can be achieved by performing ATPG on the transformed circuits.

Retiming is one such transformation. Retiming is primarily used to enhance circuit performance or operating speed, usually at the expense of increased circuit complexity and silicon area. With retiming, sequential elements such as D flip-flops are moved across combinational logic gates in the manufactured circuit for the purpose of performance (clock rate) optimization but usually at the expense of an increased number of sequential elements in the manufactured circuit. In this embodiment, the invention uses the retiming transformation to minimize the number of sequential elements in a transformed circuit thereby reducing the amount of computer time required for test generation. Importantly, the generated test pattern for the transformed version of the circuit achieves the same test quality when applied to the manufactured circuit having more sequential elements. A prefix sequence of a few arbitrary input vectors might need to be added to the test set generated for the transformed version of the circuit to guarantee initialization of the manufactured circuit.

The invention and objects and features thereof will be more readily apparent from the following detailed description and appended claims when taken with the drawings.

BRIEF DESCRIPTION OF THE DRAWINGS

FIGS. 4A, 4B through 8A, 8B illustrate portions of an original circuit and a retimed circuit, respectively, about various nodes in a sequential logic circuit.

DESCRIPTION OF THE PREFERRED EMBODIMENT

Figure 1:
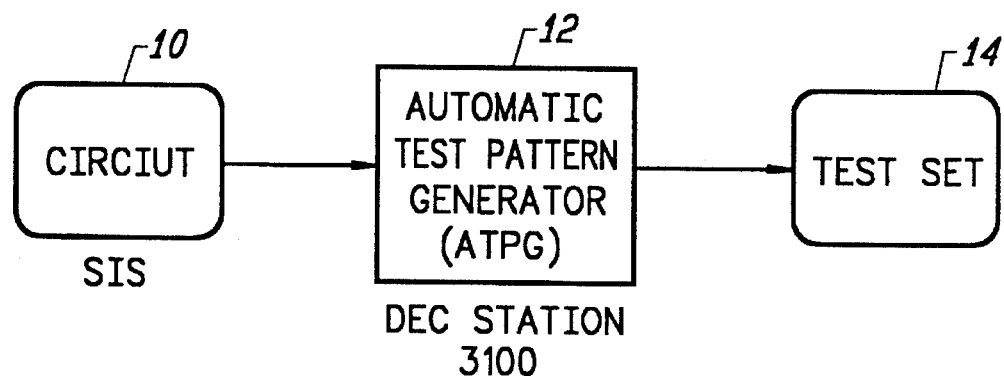
FIG. 1 is a functional block diagram illustrating test set generation in accordance with the prior art.

Referring now to the drawings, FIG. 1 illustrates the operation of apparatus in generating a test set in accordance with the prior art. Typically, a workstation such as the DECstation 3100 operating with commercially available test generation software such as HITEC receives a circuit description at 10 using a structural definition of the sequential logic circuit including a description of logic elements and memory storage elements within the circuit and the interconnections between these elements.

The workstation then operates under the control of the automatic test pattern generation (ATPG) software at 12 to generate a test set for exercising the sequential logic circuit and detecting any faults.

The effectiveness of the automatic test pattern generation software in operating on the described circuit can be quantified by measuring the amount of computer time which the automatic test pattern generation software requires to generate the manufacturing test set for the circuit along with the resultant quality of that manufacturing test set.

Automatic test pattern generation programs for sequential circuits involve three separate tasks. The values of the machine state and primary input values which excite the fault must first be determined. Next a justification sequence must be derived in order to attain the value of the excitation state on the state bits. Finally, the effect of the fault must be propagated to a primary output. The task of exciting the fault is the least difficult of these. The tasks of state justification and fault propagation are considerably more complex as they both involve traversing distinct states of the circuit.

For structural test generation, the complexity of state traversal is related to the size of the state space which must be traversed. The total number of possible states in a circuit is $2^{\#D \ flip\text{-}flops}$. However not all states are necessarily valid, meaning that not all states can be traversed. Valid states are those states which can be reached from the reset state of the machine. A state which cannot be reached from the reset state is called an invalid state. The circuit is known to be in a reset state after either a hardware reset or a synchronizing sequence of inputs is applied. Structural test generators do not possess a knowledge of the state transition information, and thus at the beginning of test generation have no knowledge of which states (combinations of D flip-flop values) are traversable. The presence of invalid states is known to increase the difficulty of state traversal. The amount of computer time necessary to generate the test set, as well as the resultant quality of the test set, are dependent upon the ratio of the number of valid states to the total number of states in the circuit. The higher this ratio, the lesser the amount of computer time required to generate a test set of a desired quality level.

Figure 2:
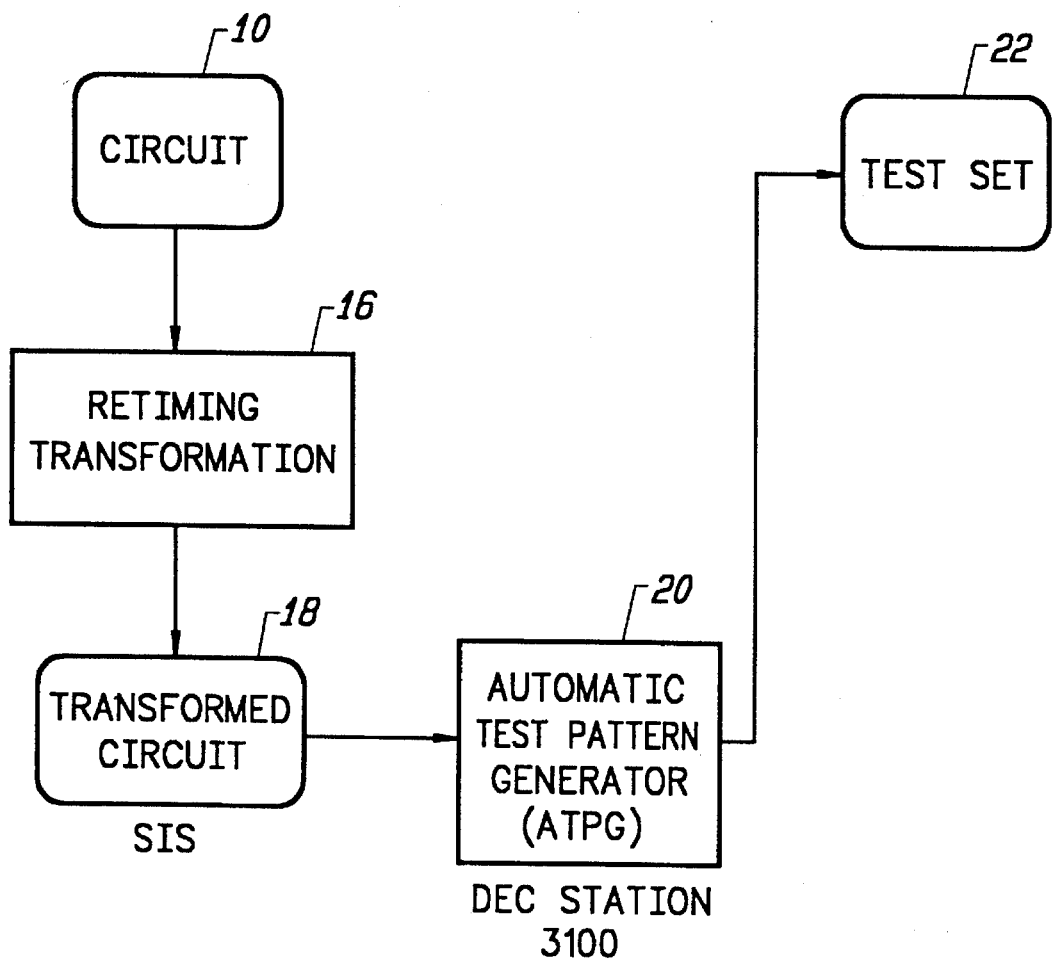
FIG. 2 is a functional block diagram of test set generation in accordance with the invention.

In accordance with the invention as illustrated in FIG. 2, the physical description of the circuit 10 as used above in the system of FIG. 1 is first transformed at 16 to increase the percentage of the total number of states which are traversable, and then the transformed circuit at 18 is operated on by the automatic test pattern generation software 20 in generating the test set at 22. Test set generation for detecting faults in a manufactured circuit in accordance with the invention is applicable to any circuit transformation in which the test set operates equally well on the transformed and on the manufactured circuit. The specific embodiments which will now be described are based on the retiming transformation, which is often used in sequential logic circuit design to increase operating speed at the expense of added sequential elements.

Retiming is a technique which moves sequential elements across combinational logic gates or fanout stems for the purpose of performance optimization or to minimize the number of sequential elements and thereby reduce the area of the circuit. Retiming is commonly viewed as a technique which increases performance (increases the operating speed of the circuit) at the expense of additional area.

Figure 3A:
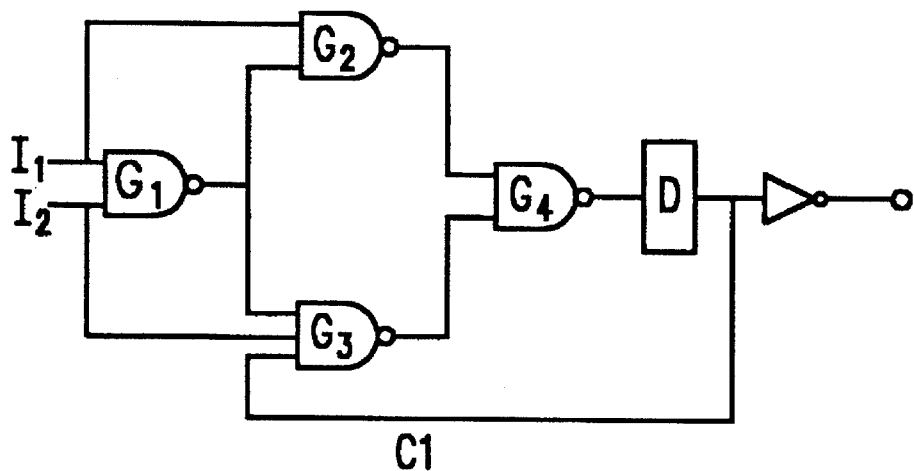
FIGS. 3A, 3B are circuits illustrating an example of retiming transformation.
Figure 3B:
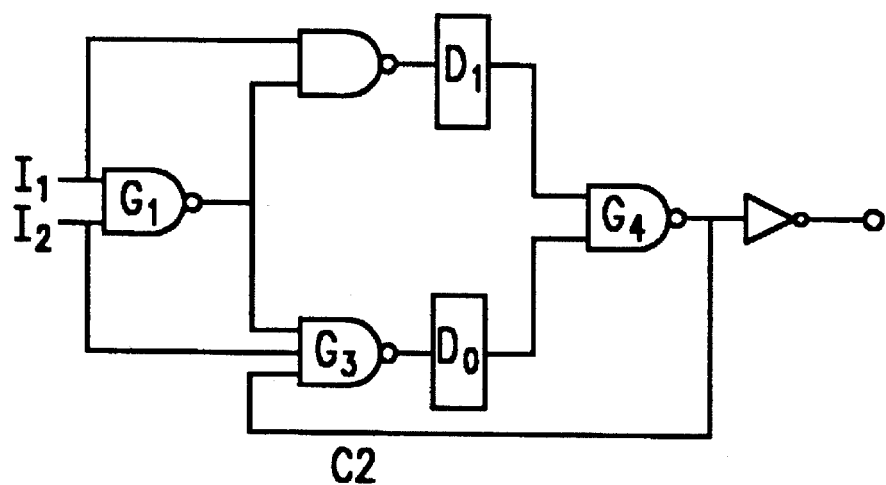
Figure 4A:
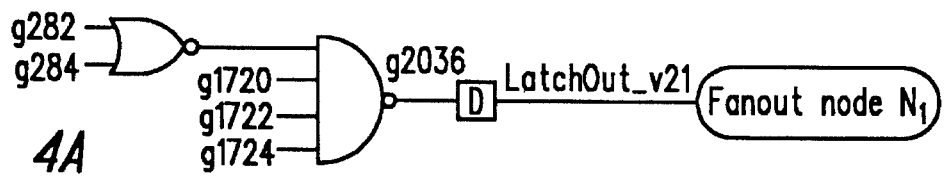
Figure 4B:
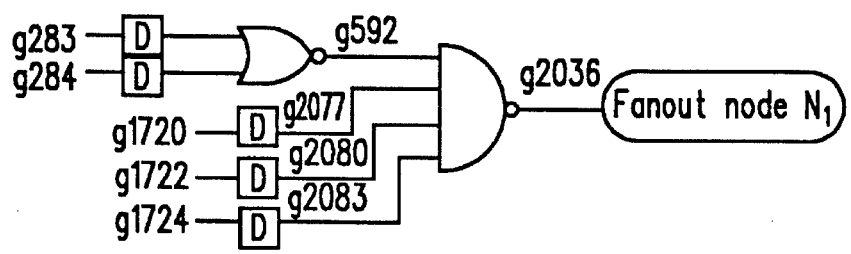
Figure 5A:
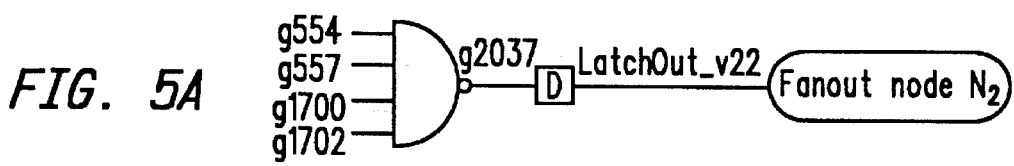
Figure 5B:
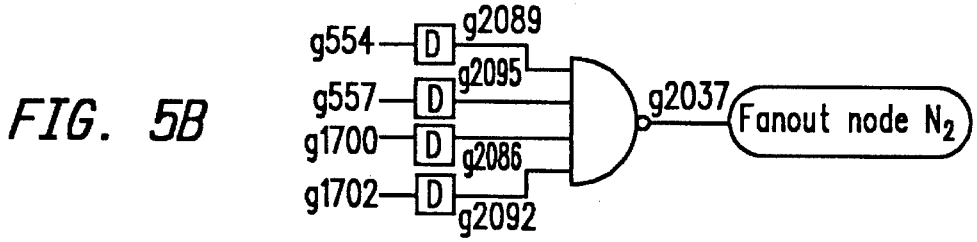
Figure 6A:
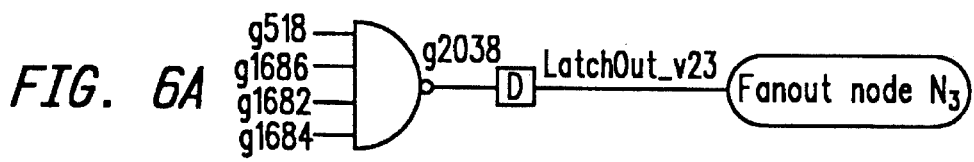
Figure 6B:
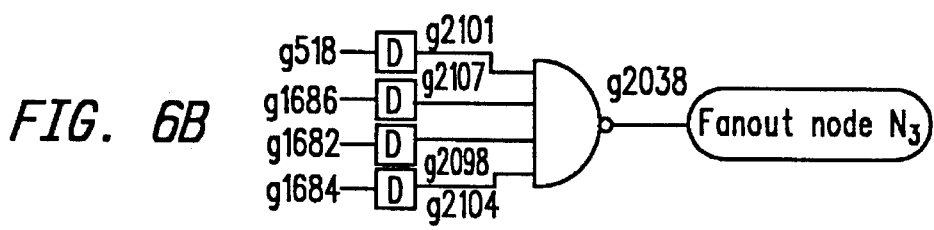

FIGS. 3A, 3B illustrate how retiming can be employed to increase performance at the expense of additional area (sequential elements). In this example it is assumed that the delay through combinational gates is relative to the number of inputs for that gate, and that setup and hold times on the sequential elements .(edge-triggered D flip-flops, denoted by D, D0, and D1) are negligible. The delay along the critical path through the circuit of FIG. 3A has a relative value of 7, and is comprised by the path from the primary inputs (I1, I2) through the combinational gates G1, G3, and G4, to the D flip-flop D. The relative delays through the gates G1, G3, and G4 are 2, 3, and 2, respectively. The critical path through the circuit of FIG. 3A can be reduced if the circuit is retimed to produce the circuit of FIG. 3B.

Retiming replaces the single D flip-flop Q at the output of gate G4 in FIG. 3A with two D flip-flops (D0 and D1) at the inputs to gate G4 in FIG. 3B.

FIG. 3B circuit has the same input/output (I/O) behavior as FIG. 3A circuit, however the relative value of the critical path through the circuit of FIG. 3B is reduced to five from seven, thus yielding an improvement of two delay units. The maximum delay through FIG. 3B occurs along two separate paths.

The first path connects the primary inputs (I1, I2) to the D flip-flop D0 through the combinational gates G1 and G3. The second path is the cycle that begins and ends at D flip-flop D0, and traverses combinational gates G3 and G4.

While the retiming transformation is most commonly used to increase performance (i.e. clock speed) at the expense of additional sequential elements (area), this transformation has the very important property that it preserves testability. The retiming transformation has also been shown to significantly impact the complexity of sequential ATPG. Retiming can be used to alter both the number of valid states and the number of total states. In particular, retiming can be used to increase the ratio of the number of valid states to the total number of states. Knowledge of the combination of these properties can be used to significantly decrease the difficulty and cost of generating a manufacturing test set.

This is demonstrated in the following example which considers the testability of two circuits, each of which can be obtained from the other via the retiming transformation (i.e. a test set preserving transformation).

Both circuits were synthesized from a single finite state machine description. This finite state machine has 20 functional inputs, 7 functional outputs, and a total of 47 states. As is well known in the art, finite state machines are so named because the sequential elements that implement them can only attain a fixed number of possible values (states). Finite state machines can be represented in terms of a state transition table which lists the values of the functional outputs and the next state in terms of the present state and values of the functional inputs.

The involved circuits were synthesized using the SIS sequential logic synthesis tool. Steps in the synthesis were as follows. State assignment was first performed using the minimum number of binary digits required to represent the states of the finite state machine. For the finite state machine, a minimum of 6 binary digits are required to represent 47 states.

State encoding assigns a combination of state bit values to each of the states of the machine as listed in a state transition table. The 17 unused state encodings were then stored as "don't care" conditions for use in combinational logic synthesis, which was next performed to synthesize the combinational logic which implements the next state and functional output functions.

The resultant circuit, termed original_ckt, contains 6 sequential elements (edge-triggered D flip-flops) and combinational logic gates. The retiming transformation was then applied to original_ckt circuit in order to decrease the maximum delay through the circuit (optimize for performance). The resultant circuit retimed_ckt, contains 28 edge-triggered D flip-flops, and the exact same number and type of combinational logic gate as does original_ckt. According to the area and delay specifications of the logic gate elements in the logic gate library which accompanies SIS, retimed_ckt can be operated at a rate 5.4% faster than original_ckt, however retimed_ckt has an area which is 29.2% larger than original_ck.

The circuits original_ckt and retimed_ckt differ structurally in the following ways as illustrated in FIGS. 4A, 4B through FIGS. 8A, 8B for the original_ckt and retimed_ckt, respectively.

In forming retimed_ckt from original_ckt, the D flip-flop with D input at node g2036 and Q output at node LatchOut_v21 is retimed backwards across the NAND gate with output g2036 and the NOR gate with output g592. The D flip-flop with D input at node g2036 and Q output at node LatchOut_v21 is removed, and nodes g2036 and LatchOut_v21 in original_ckt are merged into node g2036 in retimed_ckt. D flip-flops are inserted at the following nodes in retimed_ckt: g283 (node g2074 is created to become the Q output); g284 (node g2071 is created to become the Q output); g1724 (node g2083 is created to become the Q output); g1720 (node g2077 is created to become the Q output); g1722 (node g2080 is created to become the Q output). See FIGS. 4A, 4B for graphical summary of these changes.

The D flip-flop with D input at node g2037 and Q output at node LatchOut_v22 is retimed backwards across the NAND gate with output g2037. Nodes g2037 and LatchOut v22 in original_ckt are merged to become node g2037 in retimed_ckt. D flip-flops are inserted at the following nodes in retimed_ckt: g554 (node g2089 is created to become the Q output); g557 (node g2095 is created to become the Q output); g1700 (node g2086 is created to become the Q output); g1702 (node g2092 is created to become the Q output). See FIGS. 5A, 5B for graphical summary of these changes.

The D flip-flop with D input at node g2038 and Q output at node LatchOut v23 is retimed backwards across the NAND gate with output g2038. Nodes g2038 and LatchOut v23 in original_ckt are merged to become node g2038 in retimed_ckt. D flip-flops are inserted at the following nodes in retimed_ckt: g518 (node g2101 is created to become the Q output); g1686 (node g2107 is created to become the Q output); g1682 (node g2098 is created to become the Q output); g1684 (node g2104 is created to become the Q output). See FIGS. 6A, 6B for graphical summary of these changes.

The D flip-flop with D input at node g2039 and Q output at node LatchOut v24 is retimed backwards across the NAND gate with output g2039. Nodes g2039 and LatchOut v24 in original_ckt are merged to become node g2039 in retimed_ckt. D flip-flops are inserted at the following nodes in retimed_ckt: g461 (node g2113 is created to become the Q output); g1666 (node g2119 is created to become the Q output); g1662 (node g2110 is created to become the Q output); g1664 (node g2116 is created to become the Q output). See FIGS. 7A, 7B for graphical summary of these changes.

The D flip-flop with D input at node g2040 and Q output at node LatchOut v25 is retimed backwards across the NAND gate with output g2040, and the NOR gates with outputs g363, g224, g209, g230, and g231. Nodes g2040 and LatchOut v25 in original_ckt are merged to become node g2040 in retimed_ckt.

D flip-flops are inserted at the following nodes in retimed_ckt: g371 (node g2149 is created to become the Q output); IN_19_buf (node g2146 is created to become the Q output); g1525 (node g2143 is created to become the Q output); g945 (node g2140 is created to become the Q output); g229 (node g2134 is created to become the Q output); g232 (node g2137 is created to become the Q output); g10 (node g2125 is created to become the Q output); g210 (node g2122 is created to become the Q output); IN_0_buf (node g2128 is created to become the Q output); OUT_4_buf (node g2131 is created to become the Q output). See FIGS. 8A, 8B for graphical summary of these changes.

The HITEC sequential ATPG tool was used to derive a test set for retimed_ckt. HITEC was able to attain only a 56.5% fault coverage and 57.0% fault efficiency in 1 million CPU seconds (on a DECstation 3100 workstation) for retimed_ckt. (Here fault coverage is defined as the percentage of total faults which the test set is able to detect. Fault efficiency is defined as the percentage of total faults which the ATPG either generates a test to detect or determines to be redundant.)

It is known that the greater the ratio of the number of valid states to the total number of possible state combinations in the circuit under test, the easier it is for heuristics for sequential ATPG to generate a manufacturing test set for that circuit. Thus an ATPG tool should be able to generate a manufacturing test set which attains a high fault coverage in a lesser amount of CPU time for original_ckt than for retimed_ckt. Because original_ckt and retimed_ckt can be obtained from one another via the retiming transformation, and because the retiming transformation is test set preserving, the same high level of test quality will result when the test set obtained by targeting original_ckt is applied to retimed_ckt.

HITEC requires only 3902 CPU seconds (on the same model DECstation 3100 workstation) to generate a test set which attains 96.2% fault coverage and 100% fault efficiency for original_ckt. A copy of this test set is included in Appendix E. (This test set detects 589 of the 612 total faults in original_ckt. HITEC labeled the remaining 23 faults as redundant.) This test set attains a fault coverage of 96.2% when fault simulated on retimed_ckt (631 of the 656 faults are detected).

In summary, by targeting original_ckt (which is a transformed version of retimed_ckt) instead of retimed_ckt, the HITEC sequential ATPG tool is able to generate a manufacturing test set in substantially less time (3902 CPU seconds) than when retimed_ckt is targeted (1 million CPU seconds).

Furthermore, the test set which HITEC generates by targeting original_ckt attains a much higher fault coverage (96.2%) when fault simulated on retimed_ckt than does the test set which HITEC generates by targeting retimed_ckt. (The latter test set attains only a 56.5% fault coverage.)

The invention has proved to be successful in generating test set patterns for sequential logic circuits which have been transformed to enhance speed of operation at the expense of circuit complexity. While the invention has been described with reference to specific embodiments employing the retiming transform, the description is illustrative of the invention and not limiting the invention. Various modifications and applications may occur to those skilled in the art without departing from the spirit and scope of the invention as defined by the appended claims.

What is claimed is:

1. A method of test pattern generation for a sequential logic circuit by using a modified version at the circuit, said method including
   a) transforming an original sequential logic circuit to a modified circuit while preserving the testability of a test set, and
   b) generating a test pattern for said modified circuit which can then be used with said original sequential logic circuit to detect faults.

2. The method as defined by claim 1 wherein said modified circuit has fewer sequential elements than said original sequential logic circuit.

3. The method as defined by claim 1 wherein said step of transforming includes application of a retiming transform.

4. The method as defined by claim 3 wherein said original sequential logic circuit includes a plurality of combinational logic gates interconnected by a plurality of sequential elements, said step of retiming including moving sequential elements across combinational elements to reduce the number of sequential elements.

5. Apparatus for test pattern generation for a sequential logic circuit, said apparatus including:
   a) means for transforming an original sequential logic circuit to a modified circuit while preserving the testability of a test set, and
   b) means for generating a test pattern for said modified circuit which can then be used with said original sequential logic circuit to identify faults.

6. Apparatus as defined by claim 5 wherein said test circuit has fewer sequential elements than said sequential logic circuit.

7. Apparatus as defined by claim 5 wherein said means for transforming includes means for application of a retiming transform.

8. Apparatus as defined by claim 7 wherein said original sequential logic circuit includes a plurality of combinational logic gates interconnected by a plurality of sequential elements, said means for transforming including means for moving sequential elements across combinational elements to reduce the number of sequential elements.

\* \* \* \* \*